United States Patent
Illek et al.

(10) Patent No.: US 9,653,670 B2
(45) Date of Patent: May 16, 2017

(54) METHOD FOR PRODUCING AN OPTOELECTRONIC SEMICONDUCTOR COMPONENT, AND OPTOELECTRONIC SEMICONDUCTOR COMPONENT

(71) Applicant: OSRAM Opto Semiconductors GmbH, Regensburg (DE)

(72) Inventors: Stefan Illek, Donaustauf (DE); Walter Wegleiter, Nittendorf (DE); Karl Weidner, München (DE); Stefan Stegmeier, München (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 100 days.

(21) Appl. No.: 14/378,610

(22) PCT Filed: Jan. 17, 2013

(86) PCT No.: PCT/EP2013/050838
§ 371 (c)(1),
(2) Date: Aug. 13, 2014

(87) PCT Pub. No.: WO2013/120646
PCT Pub. Date: Aug. 22, 2013

(65) Prior Publication Data
US 2015/0014737 A1   Jan. 15, 2015

(30) Foreign Application Priority Data
Feb. 13, 2012   (DE) .................. 10 2012 002 605

(51) Int. Cl.
*H01L 33/00* (2010.01)
*H01L 21/00* (2006.01)
(Continued)

(52) U.S. Cl.
CPC .............. *H01L 33/64* (2013.01); *H01L 27/15* (2013.01); *H01L 33/005* (2013.01); *H01L 33/36* (2013.01); *H01L 33/486* (2013.01); *H01L 33/52* (2013.01); *H01L 33/62* (2013.01); *H01L 25/0753* (2013.01); *H01L 33/54* (2013.01); *H01L 33/647* (2013.01); *H01L 2224/48091* (2013.01);
(Continued)

(58) Field of Classification Search
None
See application file for complete search history.

(56) References Cited

U.S. PATENT DOCUMENTS

| 6,885,099 | B2 * | 4/2005 | Ogawa ..................... G02B 6/43 257/701 |
|---|---|---|---|
| 8,723,192 | B2 | 5/2014 | Weidner et al. |
| 2009/0127573 | A1 | 5/2009 | Guenther et al. |
| 2009/0160043 | A1 | 6/2009 | Shen et al. |
| 2009/0173954 | A1 | 7/2009 | Beeson et al. |
| 2009/0218588 | A1 | 9/2009 | Panaccione et al. |
| 2009/0278159 | A1 | 11/2009 | Wang et al. |

(Continued)

FOREIGN PATENT DOCUMENTS

DE   102009036621 A1   2/2011

*Primary Examiner* — Calvin Choi
(74) *Attorney, Agent, or Firm* — Slater Matsil, LLP

(57) ABSTRACT

In at least one embodiment, the semiconductor component includes at least one optoelectronic semiconductor chip having a radiation exit side. The surface-mountable semiconductor component comprises a shaped body that covers side surfaces of the semiconductor chip directly and in a positively locking manner. The shaped body and the semiconductor chip do not overlap, as seen in a plan view of the radiation exit side.

20 Claims, 4 Drawing Sheets

(51) Int. Cl.

| | |
|---|---|
| *H01L 33/64* | (2010.01) |
| *H01L 33/48* | (2010.01) |
| *H01L 33/62* | (2010.01) |
| *H01L 27/15* | (2006.01) |
| *H01L 33/36* | (2010.01) |
| *H01L 33/52* | (2010.01) |
| H01L 25/075 | (2006.01) |
| H01L 33/54 | (2010.01) |

(52) U.S. Cl.
CPC .............. *H01L 2224/48137* (2013.01); *H01L 2933/005* (2013.01); *H01L 2933/0016* (2013.01); *H01L 2933/0025* (2013.01); *H01L 2933/0066* (2013.01)

(56) References Cited

U.S. PATENT DOCUMENTS

| | | |
|---|---|---|
| 2010/0096746 A1 | 4/2010 | Tseng et al. |
| 2010/0171135 A1 | 7/2010 | Engl et al. |
| 2011/0018018 A1 | 1/2011 | Wang et al. |
| 2011/0084300 A1* | 4/2011 | Park ................. H01L 33/508 257/98 |
| 2011/0133219 A1 | 6/2011 | Chen |
| 2011/0175136 A1* | 7/2011 | Lin ................... H01L 21/486 257/99 |
| 2011/0215365 A1 | 9/2011 | Lin |
| 2011/0278610 A1* | 11/2011 | Jeong ................ H01L 33/508 257/98 |
| 2011/0291149 A1* | 12/2011 | Sugizaki ........... H01L 33/647 257/99 |

\* cited by examiner

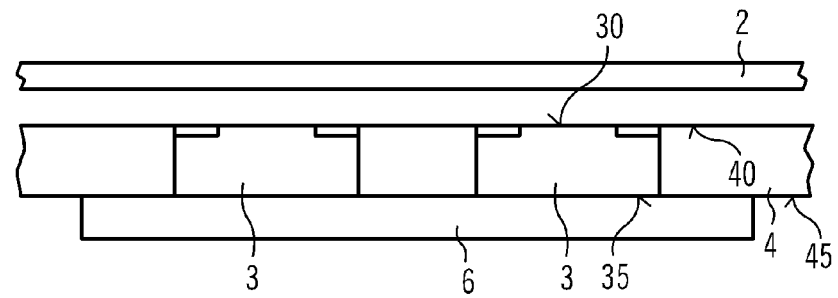
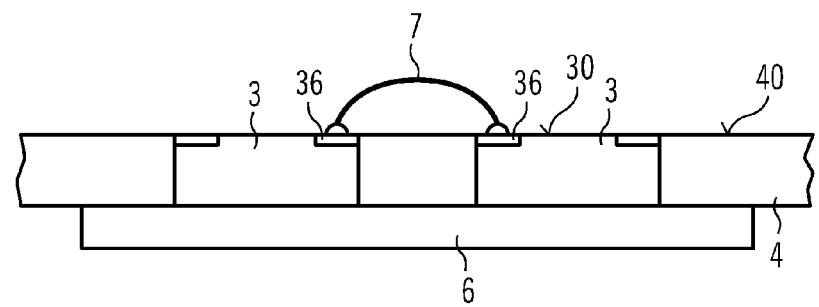
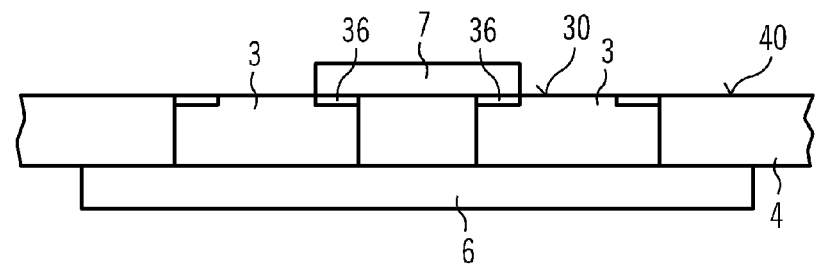
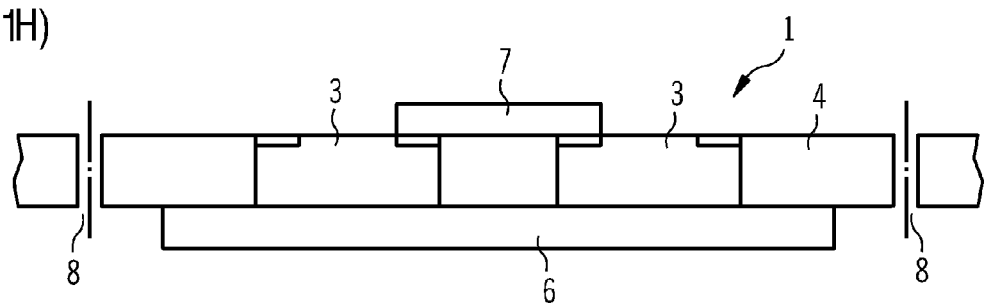

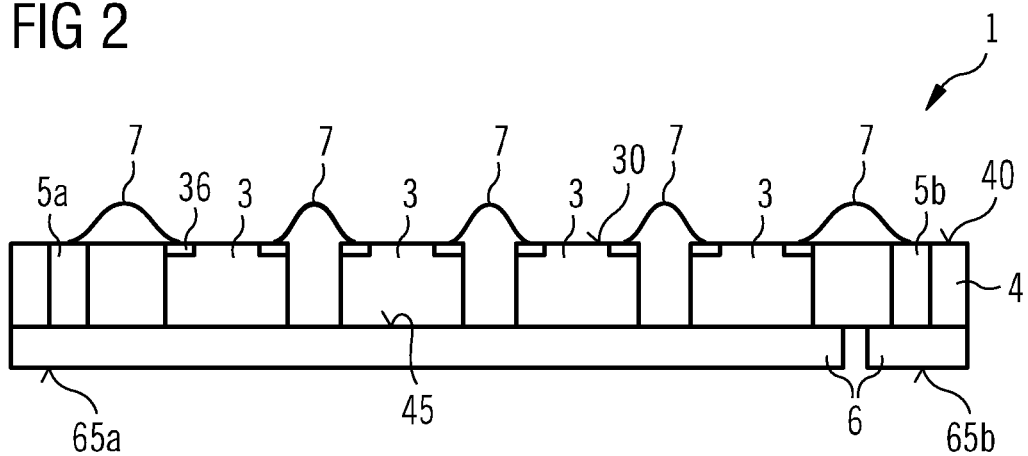
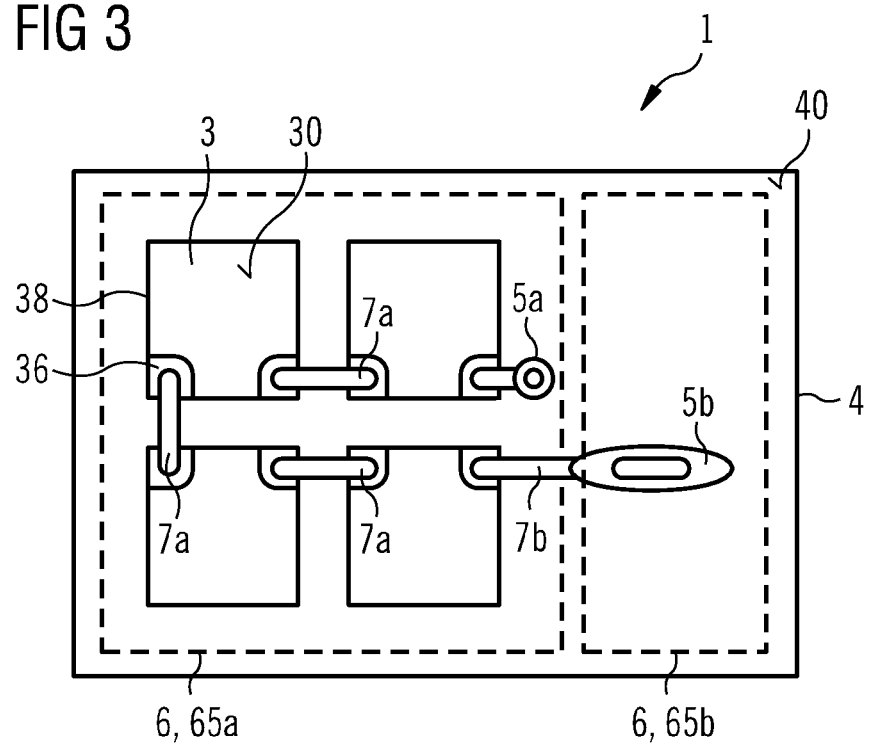

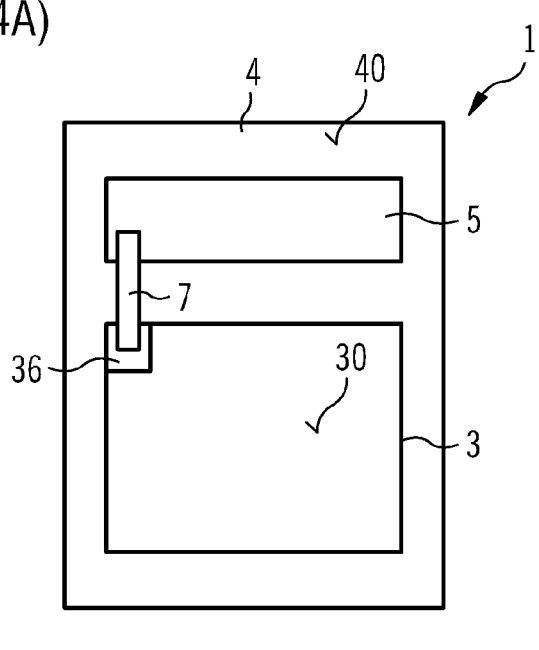
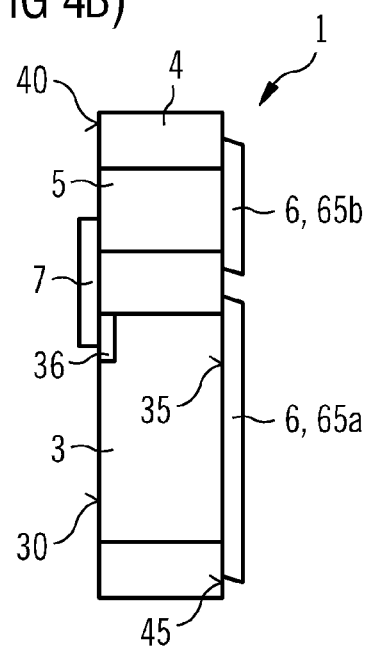
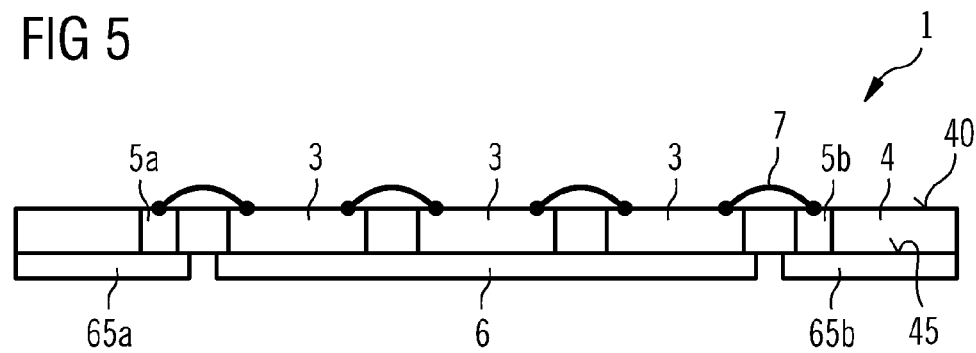

METHOD FOR PRODUCING AN
OPTOELECTRONIC SEMICONDUCTOR
COMPONENT, AND OPTOELECTRONIC
SEMICONDUCTOR COMPONENT

This patent application is a national phase filing under section 371 of PCT/EP2013/050838, filed Jan. 17, 2013, which claims the priority of German patent application 10 2012 002 605.6, filed Feb. 13, 2012, each of which is incorporated herein by reference in its entirety.

TECHNICAL FIELD

A method for producing an optoelectronic semiconductor component is specified. Furthermore, an optoelectronic semiconductor component is specified.

BACKGROUND

An optoelectronic semiconductor component is specified in the German patent document DE 10 2009 036 621 A1, also published as U.S. Pat. No. 8,723,192 B2.

SUMMARY OF THE INVENTION

Embodiments specify an optoelectronic semiconductor component from which heat can be dissipated efficiently.

In accordance with at least one embodiment of the semiconductor component, the latter comprises one or a plurality of optoelectronic semiconductor chips. The semiconductor chips are preferably light-emitting diodes, LEDs for short. The semiconductor chips can be designed to emit an ultraviolet, visible and/or near-infrared radiation during operation. Preferably, the semiconductor chips emit colored light or white light. The semiconductor chips can comprise a chip substrate and a semiconductor layer sequence. The chip substrate then constitutes a component part which carries the semiconductor chip. The chip substrate can be a growth substrate for the semiconductor layer sequence or a carrier substrate different therefrom.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or else an arsenide compound semiconductor material such as $Al_nIn_{1-n-m}Ga_mAs$, wherein in each case $0 \leq n \leq 1$, $0 \leq m \leq 1$ and $n+m \leq 1$. In this case, the semiconductor layer sequence can comprise dopants and additional constituents. For the sake of simplicity, however, only the essential constituents of the crystal lattice of the semiconductor layer sequence, that is to say Al, As, Ga, In, N or P, are specified, even if these can be replaced and/or supplemented in part by small amounts of further substances.

The semiconductor layer sequence comprises at least one active layer designed for generating an electromagnetic radiation. The active layer comprises in particular at least one pn junction and/or at least one quantum well structure. A radiation generated by the active layer during operation is, in particular, in the spectral range of between 400 nm and 800 nm inclusive.

In accordance with at least one embodiment, the semiconductor chip has a radiation exit side. The radiation exit side is preferably a main side of the semiconductor chip which is oriented, for example, perpendicularly to a growth direction of the semiconductor layer sequence. In particular, the semiconductor chip has exactly one radiation exit side. Preferably no or only little radiation is emitted at side surfaces of the semiconductor chip.

In accordance with at least one embodiment of the semiconductor component, the latter comprises a shaped body. The shaped body is produced by means of pressing, casting or injection molding, for example. The shaped body surrounds the at least one semiconductor chip all around, as seen in a plan view of the radiation exit side. Preferably, the shaped body partly or completely covers the side surfaces of the semiconductor chip. The side surfaces are those boundary surfaces of the semiconductor chip which are oriented perpendicularly to the radiation exit side or substantially perpendicularly thereto.

In accordance with at least one embodiment, the shaped body is shaped onto the semiconductor chip directly and in a positively locking manner. In other words, the shaped body is then in direct, physical contact with the side surfaces of the semiconductor chip, preferably only with said side surfaces.

In accordance with at least one embodiment, the semiconductor component is surface-mountable. The semiconductor component is therefore a so-called SMT component. Electrical contact areas of the semiconductor component then lie in a common plane.

In accordance with at least one embodiment of the semiconductor component, the shaped body and the semiconductor chip do not overlap, as seen in a plan view of the radiation exit side. The shaped body and the semiconductor chip therefore do not mutually cover one another, as seen in plan view.

In accordance with at least one embodiment of the semiconductor component, coefficients of thermal expansion of the semiconductor chips, in particular of the chip substrates, and of the shaped body deviate from one another by at most a factor of 5 or by at most a factor of 4 or by at most a factor of 3 or by at most a factor of 2 or by at most a factor of 1.5. In other words, the semiconductor chips and the shaped body have coefficients of thermal expansion, CTE for short, that are similar to one another.

In accordance with at least one embodiment of the semiconductor component, the shaped body is formed by a plastic. For matching the coefficient of thermal expansion, it is possible for the plastic of the shaped body to serve as matrix material and for particles for setting the coefficient of thermal expansion and further properties to be embedded into the matrix material. By way of example, thermoplastics, epoxides and/or silicones are used as matrix material for the shaped body. The particles can be formed from a silicon oxide, a titanium oxide and/or an aluminum oxide.

In accordance with at least one embodiment, the semiconductor component comprises at least four of the semiconductor chips or at least eight or at least 20 or at least 50. The semiconductor chips are preferably arranged linearly or in a matrix-like fashion.

In at least one embodiment, the semiconductor component comprises one or, preferably, a plurality of optoelectronic semiconductor chips having a radiation exit side. The surface-mountable semiconductor component comprises a shaped body, which covers side surfaces of the semiconductor chip directly and in a positively locking manner. The shaped body and the semiconductor chip do not overlap, as seen in a plan view of the radiation exit side. Preferably, coefficients of thermal expansion of the semiconductor chip and of the shaped body deviate from one another at most by a factor of 4.

In accordance with at least one embodiment, the semiconductor component comprises at least one heat spreader.

The heat spreader is preferably arranged to a mounting side of the semiconductor component, which can be situated opposite the radiation exit side. The semiconductor component is fixed to an external carrier by means of the mounting side. The heat spreader is electrically conductive and formed, for example, from a metal or from a metal alloy. Equally, the heat spreader can be formed from a thermally conductive and electrically insulating material. It is possible for the heat spreader to be electrically insulated from the semiconductor layer sequence of the at least one semiconductor chip.

In accordance with at least one embodiment of the semiconductor component, the heat spreader is structured to form two or more than two electrical contact locations. The contact locations are designed for externally making electrical contact with the semiconductor component. By way of example, the contact locations and the heat spreader are provided for being arranged at an external carrier by means of soldering or adhesive bonding.

In accordance with at least one embodiment, the heat spreader has a thickness of at least 10 µm or of at least 20 µm or of at least 50 µm. Alternatively or additionally, the thickness is at most 500 µm or at most 250 µm or at most 150 µm.

By means of a shaped body which is in direct contact with the semiconductor chips and which can have a high thermal conductivity, and also by means of the heat spreader, an efficient dissipation of heat from the semiconductor component is achievable. A high packing density of the semiconductor chips is achievable as a result.

In accordance with at least one embodiment of the semiconductor component, the heat spreader is arranged directly to the shaped body and to the semiconductor chips. In other words, the heat spreader then touches the semiconductor chips or at least some of the semiconductor chips and the shaped body. Alternatively, it is possible for there to be situated between the heat spreader and the semiconductor chips and/or the shaped body an adhesion layer, for instance in the form of one or a plurality of metal layers, by means of which an improved mechanical connection of the heat spreader to the semiconductor chips and to the shaped body can be realized. Preferably, apart from the contact metallization, no further component parts are situated between the heat spreader and the semiconductor chips and the shaped body.

In accordance with at least one embodiment of the semiconductor component, the latter comprises one or a plurality of electrical feedthroughs. The electrical feedthroughs pass through the shaped body preferably completely. The electrical feedthroughs can extend from the mounting side to a body top side of the shaped body that is situated opposite said mounting side. The electrical feedthroughs enable an electrical connection from the body top side to the heat spreader. By way of example, the electrical feedthroughs are formed by a semiconductor material or a metal.

In accordance with at least one embodiment of the semiconductor component, the latter comprises one or a plurality of electrical connections. The electrical connectors (or electrical connecting means) are formed, for example, by bonding wires or by flat conductor tracks which can run at the body top side and be oriented parallel thereto. The electrical connectors or at least some of them are connected to electrical contact locations of the semiconductor chips and to the electrical feedthroughs. The contact locations are preferably situated at the radiation exit side.

In accordance with at least one embodiment, at least some of the semiconductor chips or all of the semiconductor chips are electrically connected in series by the electrical connectors. A plurality of groups of semiconductor chips connected in series can be present. The individual groups of the semiconductor chips connected in series are, for example, electrically drivable independently of one another.

Furthermore, a method for producing an optoelectronic semiconductor component is specified. In particular an optoelectronic semiconductor component as specified in conjunction with one or more of the embodiments mentioned above is produced by the method. Therefore, features of the method are also disclosed for the semiconductor component, and vice versa.

In accordance with at least one embodiment, the method comprises the step of providing an intermediate carrier having a carrier top side. The intermediate carrier can be a hard, planar substrate covered with a film. The film can be a so-called thermal release film.

In accordance with at least one embodiment of the method, a plurality of optoelectronic semiconductor chips are arranged on the carrier top side. In particular, the semiconductor chips are arranged directly on the intermediate carrier, preferably on the thermal release film. Plurality can mean that at least one thousand or at least five thousand or at least ten thousand of the semiconductor chips are arranged on the carrier.

In at least one embodiment, the method is designed for producing an optoelectronic semiconductor component and comprises at least or only the following steps:

providing an intermediate carrier having a carrier top side, arranging a plurality of optoelectronic semiconductor chips on the carrier top side, wherein radiation exit sides of the semiconductor chips face the carrier top side and the semiconductor chips are spaced apart from one another, producing a shaped body, which directly surrounds the semiconductor chips all around in a lateral direction and mechanically permanently connects them to one another, and removing the intermediate carrier, wherein coefficients of thermal expansion of the semiconductor chips and of the shaped body deviate from one another, for example, by at most a factor of 4.

Preferably, the individual method steps are carried out in the order specified above. Insofar as is technically possible, an order that deviates therefrom can also be realized.

During the production of LED arrays by soldering the chips, a small lateral displacement or rotation of the semiconductor chips to be soldered can take place, in particular when the solder is liquefied. In order to avoid short circuits, therefore, a minimum distance in the range of >100 µm between the semiconductor chips is required. If, as an alternative to soldering, adhesive bonding is used for arranging the semiconductor chips, then the thermal resistance is generally increased by the adhesive in comparison with a metallic solder. The packing density of the array is limited as a result.

By virtue of the process sequence described, the semiconductor chips can be packed particularly densely since the semiconductor chips do not have to be soldered, but rather only fixed temporarily on the intermediate carrier. This can be realized with a placement accuracy in the 10 µm range by means of automatic placement machines available nowadays.

In accordance with at least one embodiment, the method comprises the additional step of arranging and/or producing the heat spreader at undersides of the shaped body and of the semiconductor chips, wherein said undersides face away from the intermediate carrier. The heat spreader is preferably applied after the removal of the intermediate carrier, but can also be applied before said removal.

In accordance with at least one embodiment of the method, the heat spreader is applied in a structured fashion. In particular, the heat spreader is applied or produced in a structured fashion to form exactly two or at least two electrical contact locations of the semiconductor component.

In accordance with at least one embodiment of the method, no subsequent structuring is effected after the heat spreader has been applied and/or produced. In other words, the heat spreader is then, for example, not subsequently etched or mechanically removed again in regions.

In accordance with at least one embodiment of the method, the heat spreader is applied continuously across at least three of the semiconductor chips. The heat spreader then extends contiguously and preferably without gaps and without constrictions across the semiconductor chips. In other words, the heat spreader can be embodied in a plate-shaped fashion in places. Moreover, it is possible for the heat spreader to extend contiguously and continuously over all of the semiconductor chips, at least over groups of semiconductor chips which are provided for one of the finished produced semiconductor components.

In accordance with at least one embodiment, the heat spreader is applied to the shaped body and to the semiconductor chips electrolytically. As a result, comparatively large thicknesses of the heat spreader can be realized in a cost-effective manner.

In accordance with at least one embodiment, the heat spreader is applied in the form of a prestructured film. The film can be a metal film, for example, having a thickness of ≥100 μm or ≥200 μm.

In accordance with at least one embodiment, the semiconductor chips are applied to the intermediate carrier in such a way that all of the electrical contact locations of the semiconductor chips are situated at a side facing the intermediate carrier. In other words, all of the contact locations of the semiconductor chips can be situated at the radiation exit side and the contact locations can touch the carrier top side.

In accordance with at least one embodiment, an average distance between adjacent semiconductor chips is at least 10 μm or at least 20 μm or at least 30 μm. Alternatively or additionally, the average distance between the adjacent semiconductor chips is at most 250 μm or at most 150 μm or at most 100 μm or at most 70 μm.

In accordance with at least one embodiment of the method, the semiconductor components are formed by singulating the shaped body. In other words, an artificial wafer is formed during the production of the intermediate carrier. This artificial wafer, which preferably connects all of the semiconductor chips mechanically fixedly to one another, is then divided by sawing or by cutting, for instance, and the individual, subdivided sections with the associated semiconductor chips are then the finished semiconductor components.

In other words, the semiconductor chips temporarily fixed on the intermediate carrier are all mechanically connected to one another by an embedding process, for example, such that the artificial wafer formed by the shaped body arises. Division of the artificial wafer, for example, by means of sawing or laser separation, gives rise to the finished semiconductor components in the form of individual, subdivided sections with the associated semiconductor chips.

In accordance with at least one embodiment of the method, before producing the shaped body, one or a plurality of electrical feedthroughs are positioned on the carrier top side. Preferably, the electrical feedthroughs touch the carrier top side. It is possible for the feedthroughs to be included as a semiconductor chip when determining the average distance between adjacent semiconductor chips.

In accordance with at least one embodiment of the method, the singulated, finished produced semiconductor components each comprise one or two or more than two of the feedthroughs.

In accordance with at least one embodiment of the method, the shaped body produced and thus the artificial wafer has an average diameter of at least 100 mm or of at least 150 mm or of at least 200 mm. In this case, the shaped body can have a round outer shape or else be shaped in a rectangular fashion. It is possible for the shaped body then to have an average edge length of at least 250 mm or of at least 350 mm.

In accordance with at least one embodiment, an average pitch of the arrangement of the semiconductor chips and of the electrical feedthroughs is at most 3 mm or at most 2 mm or at most 1.5 mm. Average pitch means that an average value of a pitch along two orthogonal spatial directions is formed, if the pitch along these spatial directions differs from one another. Pitch denotes, in particular, a distance between midpoints of the semiconductor chips and/or between the feedthroughs. It is possible that only the semiconductor chips are used when determining the pitch, or that the feedthroughs count as semiconductor chips when determining the pitch.

In accordance with at least one embodiment of the method, an interconnection of the semiconductor chips is effected, in particular with the aid of the electrical connectors, after the intermediate carrier has been removed. As a result, both main sides of the semiconductor chips are freely accessible and an electrical interconnection is achievable more simply.

In accordance with at least one embodiment of the method, a thickness of the feedthroughs, perpendicular to the carrier top side and/or perpendicular to the radiation exit sides, is greater than or equal to a thickness of the semiconductor chips. Preferably, the semiconductor chips and the feedthroughs have the same thickness, within the scope of the production tolerances.

In accordance with at least one embodiment of the method, the shaped body is produced with a thickness which is greater than a thickness of the semiconductor chips. In other words, the shaped body then projects beyond the semiconductor chips, in a direction away from the carrier top side. An underside of the semiconductor chips which faces away from the intermediate carrier is covered, for example, partly or completely by a material of the shaped body. The thickness of the shaped body exceeds the thickness of the semiconductor chips, for example, by at least 5 μm or by at least 10 μm and alternatively or additionally by at most 250 μm or by at most 100 μm. Alternatively, it is possible for the shaped body to be produced significantly thicker than the semiconductor chips. A thickness of the shaped body is then, for example, between 0.75 mm and 1.5 mm inclusive or between 0.5 mm and 2.5 mm inclusive.

In accordance with at least one embodiment of the method, the shaped body is processed after it has been produced and preferably before the electrical connectors are applied and/or before the heat spreader is produced. As a result of the processing of the shaped body, which is grinding or etching, for example, the thickness of the shaped body is reduced to the thickness of the semiconductor chips. It is possible for only a material of the shaped body to be removed. Alternatively, a material of the semiconductor chips, in particular of the chip substrates, can also be removed to a small extent.

In accordance with at least one embodiment, the semiconductor chips are densely packed, as seen in plan view. In an arrangement region, the semiconductor chips then constitute a large area proportion, for example, at least 60%. The arrangement region is such a region of the semiconductor component in which the semiconductor chips are enclosed by a very narrow contour line. Regions for mounting situated in particular laterally alongside the semiconductor chips are then preferably not encompassed by the arrangement region.

Densely packed can therefore mean that the semiconductor chips in the arrangement region and/or relative to the entire semiconductor component constitute an area proportion of at least 20% or of at least 30% or of at least 45% or of at least 60% or of at least 80%, as seen in plan view.

Such optoelectronic semiconductor components can be used for lighting purposes, for example, in general lighting or as spotlights or headlamps. High luminances are achievable with such optoelectronic semiconductor components.

BRIEF DESCRIPTION OF THE DRAWINGS

An optoelectronic semiconductor component described here and a method described here are explained in greater detail below on the basis of exemplary embodiments with reference to the drawing. In this case, identical reference signs indicate identical elements in the individual figures. In this case, however, relations to scale are not illustrated; rather, individual elements may be illustrated with an exaggerated size in order to afford a better understanding.

In the figures:

FIGS. 1A to 1H show a schematic illustration of one exemplary embodiment of a method for producing optoelectronic semiconductor components described here; and FIGS. 2 to 5 show schematic illustrations of exemplary embodiments of optoelectronic semiconductor components described here.

DETAILED DESCRIPTION OF ILLUSTRATIVE EMBODIMENTS

Figure 1A:
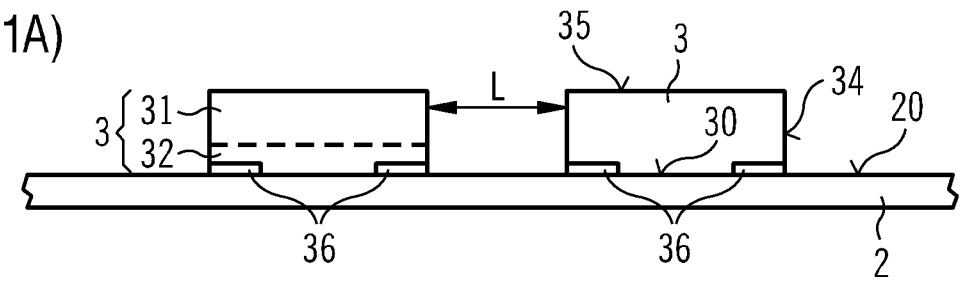

One exemplary embodiment of a method for producing an optoelectronic semiconductor component 1 is indicated in schematic sectional illustrations in FIG. 1. In the method step in accordance with FIG. 1A, a temporary intermediate carrier 2 having a carrier top side 20 is provided. A plurality of optoelectronic semiconductor chips 3 are arranged directly on the carrier top side 20.

The semiconductor chips 3 each comprise a chip substrate 31 and a semiconductor layer sequence 32, for example. By way of example, the semiconductor chips 3 are shaped as described in conjunction with U.S. Patent Application Publication No. 2010/0171135 A1, the disclosure content of which is incorporated by reference.

The semiconductor layer sequence 32 is situated closer to the intermediate carrier 2 than the chip substrate 31. In FIG. 1A, the chip substrate 31 and the semiconductor layer sequence 32 are symbolically separated from one another by a dashed line. A radiation exit side 30 of the semiconductor chips 3 is formed by that interface of the semiconductor layer sequence 32 which faces the intermediate carrier 2. Preferably in each case two electrical contact locations 36 of the semiconductor chip 3 are situated at the radiation exit side 30.

Furthermore, the semiconductor chip 3 is preferably not a so-called volume emitter. No or substantially no radiation generated in the semiconductor layer sequence 32 then passes into the chip substrate 31. By way of example, a reflective layer such as a metal mirror is then situated between the chip substrate 31 and the semiconductor layer sequence 32. Alternatively, it is also possible for the semiconductor chips 3 to be volume emitters and for a reflection layer then to be applied to the side surfaces 34 and/or to the underside 35 and/or for the shaped body 4 to be fashioned as diffusely or specularly reflective or else radiation-transmissive, that is to say transparent or translucent.

The chip substrate 31 can be formed by a ceramic such as silicon nitride, aluminum nitride or aluminum oxide. Equally, it is possible for the chip substrate 31 to be produced from a semiconductor material such as germanium. If the chip substrate 31 is formed from an electrically conductive material, then the underside 35 can be provided with an electrically insulating layer, not depicted in the figures.

The semiconductor chips 3 are arranged at the carrier top side 20 in a densely packed manner in groups for individual semiconductor components 1. Between adjacent groups, the semiconductor chips 3 can be spaced further apart from one another. Densely packed can mean that the semiconductor chips 3, relative to a basic area of the subsequently finished produced semiconductor component 1 and as seen in plan view, constitute an area proportion of at least 20% or of at least 30% or of at least 45% or of at least 60%, as is also possible in all of the other exemplary embodiments.

The individual semiconductor chips 3 have, for example, edge lengths in the range of 0.3 mm to 3 mm, in particular in the range of 0.5 mm to 2 mm. A distance L between adjacent semiconductor chips is of the order of magnitude of 100 μm. An underside 35 of the semiconductor chip 3 that faces away from the intermediate carrier 2 is formed by the chip substrate 31.

Figure 1B:
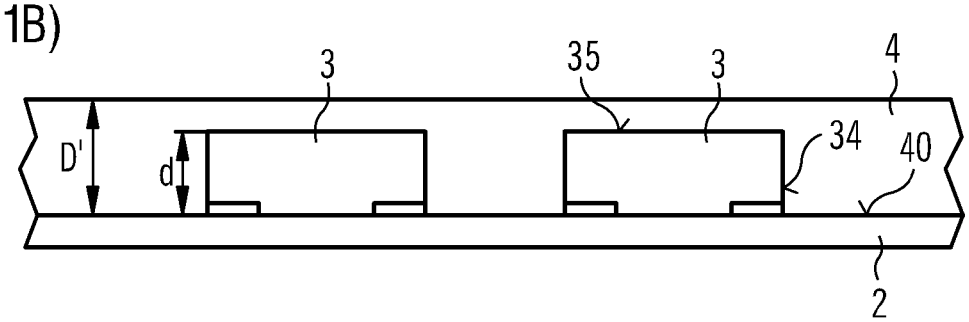

In the method step in accordance with FIG. 1B, a shaped body 4 is produced, for example, by pressing, injection molding or casting, for instance in a two-part mold. In this case, the intermediate carrier 2 preferably forms the part of a casting mold or of a pressing mold. In accordance with FIG. 1B, the shaped body is produced in such a way that it has a thickness D' greater than a thickness d of the semiconductor chips 3. A difference between the thicknesses D', d is approximately 10 μm, for example. The undersides 35 of the semiconductor chips 3 are completely covered by the shaped body 4. The shaped body is shaped onto side surfaces 34 of the semiconductor chips 3 directly and all around.

The shaped body 4 and the semiconductor chips 3, in particular the chip substrates 31, have coefficients of thermal expansion that are as similar as possible. As a result, large-area shaped bodies 4 are achievable, without the shaped bodies 4 being warped significantly, for instance as a result of heating during the operation of the optoelectronic semiconductor chips 3. The shaped bodies 4 form an artificial wafer in which all of the semiconductor chips 3 are mechanically fixedly integrated.

The shaped body 4 can comprise a matrix material composed of a plastic, in which particles serve for matching the coefficients of thermal expansion and/or for improving a thermal conductivity and/or for setting optical properties. In this regard, particles composed of titanium dioxide can be admixed with the shaped body 4, such that the shaped body 4 appears white, for example, to an observer and has a high reflectivity.

Figure 1C:
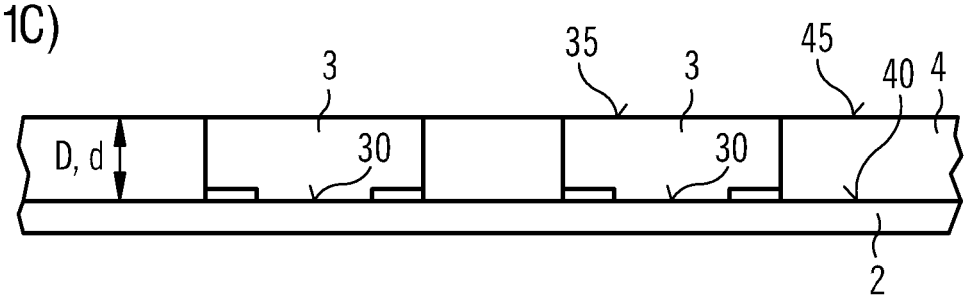

FIG. 1C shows that the material of the shaped body 4 and optionally also a material of the semiconductor chips 3 is partly removed. As a result, the undersides 35 of the semiconductor chips 3 are exposed. The shaped body 4 and the semiconductor chips 3 then have the same thicknesses D, d. The underside 35 of the semiconductor chips 3 and the underside 45 of the shaped body 4 terminate flush with one another and lie in a common plane.

In contrast to the illustration in FIGS. 1B and 1C, it is also possible for the shaped body 4 to be produced with the same thickness D as the thicknesses d of the semiconductor chips 3. The material of the shaped body 4 then does not cover any of the main sides of the semiconductor chip 3, but rather only the side surfaces 34 thereof. The step of partly removing the material of the shaped body 4, as shown in conjunction with FIG. 1C, can then be omitted.

Figure 1D:
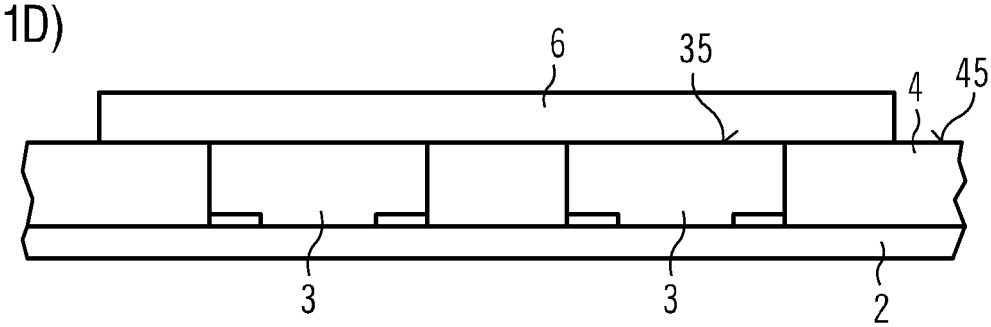

FIG. 1D illustrates the optional method step according to which a heat spreader 6 is applied to an underside 45 of the shaped body 4 that faces away from the intermediate carrier 2 and also to the undersides 35 of the semiconductor chips 3. The heat spreader 6 is preferably formed by a metal or a metal alloy and can be applied directly to the shaped body 4 and also to the semiconductor chips 3. In contrast to the illustration in FIG. 1D, it is possible for the heat spreader 6 to be applied over the entire underside 45 of the shaped body 4.

Optionally, it is possible for metallization layers to be situated between the shaped body 4 and the semiconductor chips 3, on the one hand, and the heat spreader 6, on the other hand. Such metallization layers can be formed, in a direction away from the intermediate carrier 2, by a titanium layer, a platinum layer and a gold layer, wherein these layers each have thicknesses in the range of a few hundred nanometers. Such layers are present particularly if no heat spreader 6 is produced at the undersides 45, 35 of the semiconductor chips 3 and/or of the shaped body 4. Furthermore, a solder layer, for instance AuSn, can be applied to such metallization layers and/or to the heat spreader 6.

In the method step in accordance with FIG. 1E, the intermediate carrier 2 is removed, for example, by the carrier 2 being heated. In a departure from the illustration in accordance with FIGS. 1D and 1E, alternatively it is also possible that firstly the intermediate carrier 2 is removed, and that only afterward the heat spreader 6 is produced.

In accordance with FIG. 1F, the electrical contact locations 36 of the semiconductor chips 3 are at least partly connected to one another via an electrical connector 7. In FIG. 1F, the electrical connector 7 is a bonding wire. As an alternative thereto, it is possible, see FIG. 1G, for the electrical connector 7 to be formed by conductor tracks which run parallel to the radiation exit side 30 and to the body top side 40 and to be in direct contact therewith. The radiation exit side 30 and the body top side 40 can lie in a common plane, as also in all of the other exemplary embodiments. Such contact-making is also specified in U.S. Patent Publication No. 2009/0127573 A1, the disclosure content of which is incorporated by reference. Optionally, an electrical insulation layer can be applied to the conductor tracks 7, said electrical insulation layer not being shown in FIG. 1G.

As in all of the other exemplary embodiments, too, it is possible for an optical component part such as a lens or a conversion means for wavelength conversion of radiation generated in the semiconductor chips 3 to be applied to the radiation exit sides 30. Such optical elements are not depicted in any of the figures, in order to simplify the illustration. Semiconductor chips 3 which emit in different colors can likewise be combined with one another.

In accordance with FIG. 1H, the shaped body 4 is singulated to form individual semiconductor components 1. This can be done by sawing in singulation regions 8, symbolized by dashed-dotted lines.

FIG. 2 shows a further exemplary embodiment of the optoelectronic semiconductor component 1 in a schematic sectional illustration. Two electrical feedthroughs 5a, 5b are incorporated into the shaped body 4. The electrical feedthroughs 5 can be so-called quasi-chips. An electrical connection from the body top side 40 to the underside 45 of the shaped body 4 is produced via the feedthroughs 5a, 5b. Furthermore, an electrical connection between the contact locations 36 of the semiconductor chips 3 and the heat spreader 6 is produced by the feedthroughs 5a, 5b and the electrical connectors 7.

The heat spreader 6 is structured to form electrical contact locations 65a, 65b for externally making electrical contact with the surface-mountable semiconductor component 1. In particular via the contact location 65a extending contiguously over all of the semiconductor chips 3, an efficient dissipation of heat from the semiconductor component 1 is possible.

FIG. 3 shows a further exemplary embodiment of the semiconductor component 1 in a schematic plan view. The, for example, four semiconductor chips 3 are arranged in a matrix-like fashion and electrically connected in series by the electrical connectors 7a, 7b, which are bonding wires or conductor tracks. Via the feedthrough 5a, the semiconductor chips 3 are connected to the contact location 65a of the heat spreader 6 which is situated below the semiconductor chips 3. A connection to the feedthrough 5b is produced via the electrical connector 7b. The feedthrough 5b is situated above the contact location 65b, as seen in plan view. The contact location 65b is arranged laterally alongside the semiconductor chips 3. In FIG. 3, the contact locations 65a, 65b and thus the heat spreader 6 are symbolized by dashed lines.

The semiconductor chips 3 are densely packed. In particular in an arrangement region 38 of the semiconductor chips 3, the semiconductor chips 3 occupy an area proportion, as seen in plan view, of at least 60%. In this case, the arrangement region 38 is a region which is surrounded by a very narrow contour line around the semiconductor chips 3 of the semiconductor component 1. The contour line surrounding the arrangement region 38 is depicted as a dashed-dotted line in FIG. 3.

In contrast to the illustration, a plurality of groups of semiconductor chips 3 can be present, which are preferably individually drivable. The semiconductor component 1 then preferably comprises more than two feedthroughs 5a, 5b.

In the case of the exemplary embodiment in accordance with FIG. 4, see the plan view in FIG. 4A and the sectional illustration in FIG. 4B, the semiconductor component 1 comprises only a single semiconductor chip 3. Electrical contact is made, on the one hand, directly via the underside 35 of the semiconductor chip 3 and the heat spreader 6 and the associated contact location 65a. Furthermore, an electrical connection to a mounting side of the semiconductor component 1 is formed via the contact location 36 at the radiation exit side 30, the electrical connectors 7 and the feedthrough 5 through to the contact location 65b. The contact locations 65a, 65b and the heat spreader 6 are not depicted in FIG. 4A.

In accordance with FIG. 5, the heat spreader 6 is not designed for making electrical contact with the semiconductor component 1, and this is also possible in all of the other exemplary embodiments. The heat spreader 6 is then preferably electrically insulated from the semiconductor chips 3, for example, by means of an intermediate layer (not depicted), or the heat spreader 6 is formed from an electrically non-conductive material or coated with such a material.

Equally, it is possible for the semiconductor chips 3 to have chip substrates which are electrically insulating, such that there is no electrically conductive connection between semiconductor layer sequences of the semiconductor chips 3 and the heat spreader 6. In this case, the heat spreader 6 can be electrically conductive or electrically insulating.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor component comprising:
    at least one optoelectronic semiconductor chip having a radiation exit side;
    a shaped body, which covers side surfaces of the semiconductor chip directly and in a positively locking manner; and
    a metallic heat spreader with a constant thickness that is disposed directly on an underside of the at least one optoelectronic semiconductor chip that is opposite the at least one optoelectronic semiconductor chip from the radiation exit side, and that is further disposed directly on an underside of the shaped body, wherein the underside of the at least one optoelectronic semiconductor chip is free of a material of the shaped body and is completely covered with the heat spreader;
    wherein the semiconductor component is surface-mountable, wherein the heat spreader is a part of a mounting side of the optoelectronic semiconductor component, wherein the mounting side is opposite the optoelectronic semiconductor component from a radiation exit side of the optoelectronic semiconductor component, and wherein the optoelectronic semiconductor component is configured to be fixed to an external carrier at the mounting side; and
    wherein the shaped body and the semiconductor chip do not overlap, as seen in a plan view of the radiation exit side.

2. The optoelectronic semiconductor component according to claim 1, wherein the at least one semiconductor chip comprises at least four of the semiconductor chips:
    wherein the heat spreader is structured to form at least two electrical contact locations for externally making electrical contact with the semiconductor component, or the heat spreader is electrically insulated from a semiconductor layer sequence of the semiconductor chips, wherein the heat spreader has a thickness of between 10 μm and 250 μm inclusive;
    wherein the component further comprises an electrical feedthrough from the mounting side to a body top side of the shaped body that is situated opposite said mounting side; and
    wherein the component further comprises a plurality of electrical connections that run at and parallel to the body top side and that electrically connect some of the semiconductor chips or all of the semiconductor chips in series, wherein the semiconductor chips are densely packed, such that the semiconductor chips constitute at least an area proportion of 30% of the semiconductor component, within an arrangement region of the semiconductor chips and as seen in a plan view of radiation main sides.

3. The optoelectronic semiconductor component according to claim 2, wherein coefficients of thermal expansion of the semiconductor chip and of the shaped body deviate from one another by at most a factor of 4.

4. A method for producing an optoelectronic semiconductor component, the method comprising:
    providing an intermediate carrier having a carrier top side;
    arranging a plurality of optoelectronic semiconductor chips with a radiation exit side directly on the carrier top side, wherein the semiconductor chips are spaced apart from one another;
    producing a shaped body that directly surrounds the semiconductor chips all around in a lateral direction and mechanically permanently connects them to one another, wherein at least one main side of the semiconductor chips which faces away from the intermediate carrier remains free of a material of the shaped body;
    removing the intermediate carrier; and
    after producing the shaped body and after removing the intermediate carrier, applying a metallic heat spreader with a constant thickness directly to undersides of the semiconductor chips that are opposite the radiation exit side and that face away from the intermediate carrier, and directly to an underside of the shaped body that faces away from the intermediate carrier,
    wherein the undersides of the semiconductor chips are completely covered with the heat spreader, and
    wherein the heat spreader is a part of a mounting side of the semiconductor component, wherein the mounting side is opposite the semiconductor component from a radiation exit side of the semiconductor component, and wherein the semiconductor component is configured to be fixed to an external carrier at the mounting side.

5. The method according to claim 4, wherein the heat spreader is electrically conductive and is produced to form at least two electrical contact locations of the semiconductor component.

6. The method according to claim 4, wherein the heat spreader is electrically insulated from a semiconductor layer sequence of the semiconductor chips.

7. The method according to claim 4, wherein each semiconductor chip of the plurality of optoelectronic semiconductor chips comprises exactly two electrical contact locations that are disposed on a side of the respective semiconductor chip that faces away from the heat spreader, wherein the exactly two electrical contact locations of each semiconductor chip are located in a corner region, when seen in a top view, of the respective semiconductor chip, and wherein each of the exactly two electrical contact locations terminate flush with the shaped body when seen in a cross sectional view.

8. The method according to claim 4,
    wherein a thickness of the heat spreader is between 10 μm and 250 μm inclusive;
    wherein the heat spreader is electrically conductive and is produced to form at least two electrical contact locations of the semiconductor component, or the heat spreader is electrically insulated from a semiconductor layer sequence of the semiconductor chips,
    wherein radiation exit sides of the semiconductor chips face the carrier top side when the semiconductor chips are arranged; and wherein coefficients of thermal expansion of the semiconductor chips and of the shaped body deviate from one another by at most a factor of 4.

9. The method according to claim 8,
wherein an electrical interconnection of the semiconductor chips is effected after the intermediate carrier has been removed, wherein the electrical interconnection is effected by applying electrical connectors on the radiation exit sides and on a body top side of the shaped body that runs therewith in one plane;
wherein the connectors are formed by conductor tracks that run parallel to the radiation exit side and a body top side of the body and are in direct contact with them;
wherein the radiation exit side and the body top side lie in a common plane; and
wherein the shaped body and the semiconductor chip do not overlap, as seen in a plan view of the radiation exit side.

10. The method according to claim 8, wherein the heat spreader is applied continuously across at least three of the semiconductor chips and wherein the heat spreader is not subsequently structured.

11. The method according to claim 8, wherein the heat spreader is applied electrolytically or in the form of a prestructured film.

12. The method according to claim 4, wherein coefficients of thermal expansion of the semiconductor chips and of the shaped body deviate from one another by at most a factor of 4.

13. The method according to claim 4, wherein the semiconductor chips are applied to the intermediate carrier in such a way that all electrical contact locations of the semiconductor chips are situated at a side facing the intermediate carrier.

14. The method according to claim 1, wherein the semiconductor chips are arranged in a matrix-like fashion on the intermediate carrier, wherein a distance between adjacent semiconductor chips is between 10 µm and 250 µm inclusive.

15. The method according to claim 4, wherein arranging the semiconductor chips comprises densely arranging the plurality of optoelectronic semiconductor chips on the carrier top side, such that the semiconductor chips constitute at least an area proportion of 30% of the semiconductor component.

16. The method according to claim 4,
wherein, before the shaped body is produced, a plurality of electrical feedthroughs are positioned on the carrier top side; and
wherein a thickness of the feedthroughs is greater than or equal to a thickness of the semiconductor chips.

17. The method according to claim 16,
wherein the shaped body is singulated to form a plurality of the semiconductor components; and
wherein each of the singulated semiconductor components comprises one or a plurality of the semiconductor chips and one or a plurality of the electrical feedthroughs.

18. The method according to claim 16, wherein the produced shaped body has an average diameter of at least 100 mm; and
wherein an average pitch of the arrangement of the semiconductor chips, together with the electrical feedthroughs, is at most 3 mm, and the shaped body is fashioned as an artificial wafer, such that the shaped body mechanically fixedly connects the semiconductor chips to one another.

19. The method according to claim 4, wherein an electrical interconnection of the semiconductor chips is effected after the intermediate carrier has been removed; and
wherein the electrical interconnection is effected by applying electrical connectors on the radiation exit sides and/or on a body top side of the shaped body which runs therewith in one plane.

20. The method according to claim 4, wherein the shaped body is produced with a thickness that is greater than a thickness of the semiconductor chip; and
wherein the shaped body is subsequently processed and, after the processing, the shaped body and the semiconductor chips have identical thicknesses.

* * * * *

UNITED STATES PATENT AND TRADEMARK OFFICE
CERTIFICATE OF CORRECTION

PATENT NO. : 9,653,670 B2
APPLICATION NO. : 14/378610
DATED : May 16, 2017
INVENTOR(S) : Stefan Illek It is certified that error appears in the above-identified patent and that said Letters Patent is hereby corrected as shown below:

In the Claims

In Column 13, Line 35, Claim 14, delete "claim 1" and insert --claim 4--.

Signed and Sealed this
Fourteenth Day of November, 2017

Joseph Matal
*Performing the Functions and Duties of the*
*Under Secretary of Commerce for Intellectual Property and*
*Director of the United States Patent and Trademark Office*